(12) United States Patent
Tang et al.

(10) Patent No.: US 7,166,896 B2
(45) Date of Patent: Jan. 23, 2007

(54) CROSS DIFFUSION BARRIER LAYER IN POLYSILICON

(75) Inventors: Sanh D. Tang, Boise, ID (US);
Chih-Chen Cho, Boise, ID (US);
Robert Burke, Boise, ID (US);
Anuradha Iyengar, Stafford, TX (US);
Eugene R. Gifford, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 10/228,839

(22) Filed: Aug. 26, 2002

(65) Prior Publication Data

US 2004/0036119 A1    Feb. 26, 2004

(51) Int. Cl.
*H01L 27/11* (2006.01)

(52) U.S. Cl. ................ 257/393; 257/379; 257/903; 257/E27.098

(58) Field of Classification Search ............. 257/69, 257/350, 351, 357–362, 369–381, 392, 393, 257/903, 904, E21.661, E27.098
See application file for complete search history.

(56) References Cited

U.S. PATENT DOCUMENTS

| | | | | |
|---|---|---|---|---|
| 5,218,232 A * | 6/1993 | Yuzurihara et al. | ......... | 257/754 |
| 5,313,087 A | 5/1994 | Chan et al. | .................. | 257/538 |
| 5,550,079 A * | 8/1996 | Lin | ............................. | 438/587 |
| 5,576,572 A * | 11/1996 | Maeda et al. | ................ | 257/378 |
| 5,929,493 A * | 7/1999 | Wu | ............................. | 257/369 |
| 5,940,725 A * | 8/1999 | Hunter et al. | ................ | 438/592 |
| 6,194,310 B1 * | 2/2001 | Hsu et al. | ..................... | 438/643 |
| 6,218,260 B1 * | 4/2001 | Lee et al. | ..................... | 438/398 |
| 6,583,518 B1 | 6/2003 | Trivedi et al. | ............... | 257/357 |
| 6,680,259 B1 * | 1/2004 | Lam et al. | .................... | 438/723 |
| 6,686,277 B1 * | 2/2004 | Tai | ............................... | 438/664 |
| 6,846,711 B1 * | 1/2005 | Yamasaki et al. | ............ | 438/240 |
| 2001/0002071 A1 | 5/2001 | Agarwal et al. | | |
| 2003/0006433 A1 * | 1/2003 | Funayama et al. | ........... | 257/202 |
| 2003/0040171 A1 * | 2/2003 | Weimer | ....................... | 438/585 |
| 2003/0080389 A1 | 5/2003 | Hu et al. | | |

OTHER PUBLICATIONS

Cheng, Huang-Chung, et al., "Suppression of Boron Penetration for p+ Stacked Poly-Si Gates by Using Inductively Coupled N2 Plasma Treatment", *IEEE Electron Device Letters, vol. 20, No. 10*, (Oct. 1999), 535-537.
Kwongm, Dim-Lee , et al., "Improving Performance with Oxynitride Gate Dielectrics", *Semiconductor International*, (Jul. 1, 1998).

\* cited by examiner

*Primary Examiner*—Howard Weiss
*Assistant Examiner*—Marcos D. Pizarro-Crespo
(74) *Attorney, Agent, or Firm*—Schwegman, Lundberg, Woessner & Kluth, P.A.

(57) ABSTRACT

A semiconductor device includes a cross diffusion barrier layer sandwiched between a gate layer and an electrode layer. The gate layer has a first gate portion of doped polysilicon of first conductivity type adjacent to a second gate portion doped polysilicon of second conductivity type. The cross diffusion barrier layer includes a combination of silicon and nitrogen. The cross diffusion barrier layer adequately prevents cross diffusion between the first and second gate portions while causing no substantial increase in the resistance of the gate layer.

49 Claims, 13 Drawing Sheets

CROSS DIFFUSION BARRIER LAYER IN POLYSILICON

FIELD

The present invention relates generally to semiconductor devices, and in particular to semiconductor devices having a doped polysilicon gate structure with mixed conductivity types

BACKGROUND

Some semiconductor devices have a gate structure over a substrate to control conduction between active regions within the substrate. A typical gate structure usually has a layer of polycrystalline silicon (or polysilicon) doped with some type of dopant (impurities) to form a doped polysilicon gate.

The type of the dopant defines the conductivity type of the doped polysilicon gate. An n-type polysilicon gate has a dopant that provides extra electrons. For example, arsenic is usually used as a dopant in an n-type polysilicon gate. A p-type polysilicon gate has a dopant that provides extra holes. For example, boron is commonly used as a dopant in a p-type polysilicon gate.

Some devices have two doped polysilicon gates of different conductivity types placed side by side and sharing the same gate contact that spreads across both gates. When a shared gate contact is used, a dopant from one gate may cross to the shared gate contact and diffuse to the other gate. This is cross diffusion.

The cross diffusion changes the conductivity of the two doped polysilicon gates. A small cross diffusion may cause the device to perform inefficiently. Too much cross diffusion may lead to failure of the device.

Some methods for preventing cross diffusion exist in various forms. Some of these methods, however, either increase the resistance of the doped polysilicon gates or have inadequate prevention of the cross diffusion.

SUMMARY OF THE INVENTION

The present invention provides structures and methods for adequately preventing cross diffusion in polysilicon gates without substantially increasing the resistance of the polysilicon gates.

In one aspect, a device includes a substrate having doped regions and a gate layer opposing the doped regions and separated from the substrate by a gate insulation layer. The gate layer includes a first gate portion of first conductivity type and a second gate portion of second conductivity type adjacent to the first gate portion. The device also includes a cross diffusion barrier layer sandwiched between the gate layer and an electrode layer. The cross diffusion barrier layer includes nitrogen.

Another aspect offers a method that includes forming a gate insulation layer on a substrate. A polysilicon layer is formed on the gate insulation layer. The polysilicon layer is doped with a dopant of first conductivity type in a first portion and a dopant of second conductivity type in a second portion adjacent to the first portion. The method also includes performing a nitridization process to form a cross diffusion barrier layer on the polysilicon layer. Further, an electrode layer is formed on the diffusion barrier layer.

DESCRIPTION OF EMBODIMENTS

Figure 1:
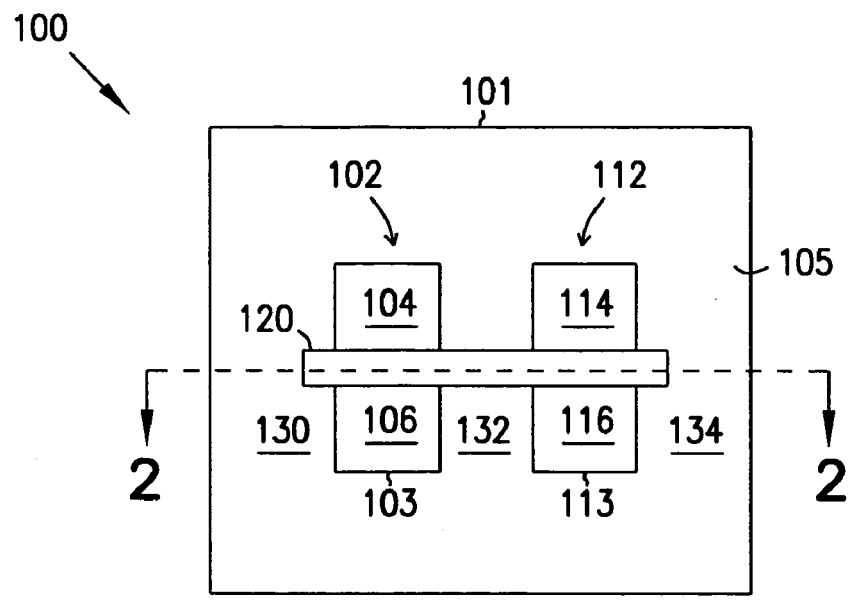
FIG. 1 is a top view of a device having a cross diffusion barrier according to an embodiment of the invention.

The following description and the drawings illustrate specific embodiments of the invention sufficiently to enable those skilled in the art to practice it. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

Figure 2:
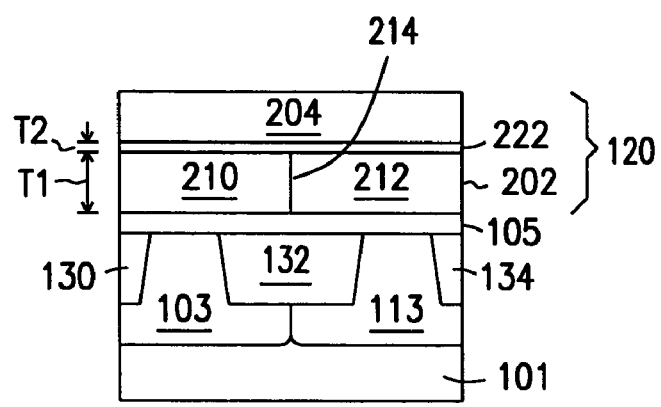
FIG. 2 is a cross-section of the device of FIG. 1.

FIG. 1 is a top view of a device having a cross diffusion barrier according to an embodiment of the invention. Device 100 includes a substrate 101 having device areas 102 and 112, and a gate structure 120 spreading across device areas 102 and 112. A number of trench isolation regions 130, 132, and 134 are located in substrate 101 with trench isolation region 132 separating device areas 102 and 112. A gate insulation (gate oxide) layer 105 lies on substrate 101. FIG. 2 shows a different view of gate insulation layer 105.

Device area 102 includes a well 103 encompassing doped regions 104 and 106. Device area 112 includes a well 113 encompassing doped regions 114 and 116. These doped regions can be used as sources and drains of transistors. For example, doped regions 104 and 106 can be used as a source and a drain of a p-channel transistor, and doped regions 114 and 116 can be used as a drain and a source of an n-channel transistor. Line 2—2 in FIG. 1 is a cross-sectional line for device 100 shown in FIG. 2.

FIG. 2 is a cross-section of the device of FIG. 1. Gate structure 120 is formed on gate insulation layer 105. Gate structure 120 includes a gate layer 202, an electrode layer 204, and a cross diffusion barrier layer 222 sandwiched between layers 202 and 204. Gate layer 202 includes a first gate portion 210, and a second gate portion 212 adjacent to first gate portion 210. Gate portions 210 and 212 join at a junction area 214.

Cross diffusion barrier layer 222 includes nitrogen. In some embodiments, cross diffusion barrier layer 222 includes a combination of silicon and nitrogen, for example, silicon nitride.

Gate portion 210 includes polysilicon doped with a dopant of first conductivity type. Gate portion 212 includes polysilicon doped with a dopant of second conductivity type. The first and second conductivity types include N-type and P-type.

In embodiments represented by FIG. 2, gate portion 210 includes polysilicon doped with a dopant, for example arsenic or phosphorous, to make it an N-type material. Gate portion 212 includes polysilicon doped with a dopant, for example boron or boron fluoride to make it a P-type material. In other embodiments, gate portion 202 can be P-type material and gate portion 212 can be N-type material.

The N-type material has excess electrons as majority carriers for conducting current. The P-type material has excess holes as majority carriers for conducting current. Further, in the specification, the term "doped region" refers to a region having a semiconductor material doped with a dopant to become either an N-type material or a P-type material.

In some embodiments, electrode layer 204 includes tungsten. In other embodiments, electrode layer 204 includes a combination of tungsten and silicon. In some other embodiments, electrode layer 204 includes other materials.

In embodiments represented by FIG. 2, cross diffusion barrier layer 222 is separated from gate layer 202. In some embodiments, however, cross diffusion barrier layer 222 is a part of gate layer 202. In these embodiments, cross diffusion barrier layer 222 is formed after nitrogen is implanted into gate layer 202 such that the implanted nitrogen and the doped polysilicon of gate layer 202 react and form cross diffusion barrier layer 222 immediately below the top surface of gate layer 202.

Gate layer 202 has a layer thickness T1. Cross diffusion barrier layer 222 has a layer thickness T2. In some embodiments, T1 is in a range of about 400 angstroms to about 600 angstroms, and T2 is about one percent of T1. In other embodiments, T2 is in a range of about 5 angstroms to about 10 angstroms. In some other embodiments, T2 equals to about the thickness of a nitrogen atom, in which cross diffusion barrier layer 222 has monolayer of single nitrogen atoms.

Figure 3:
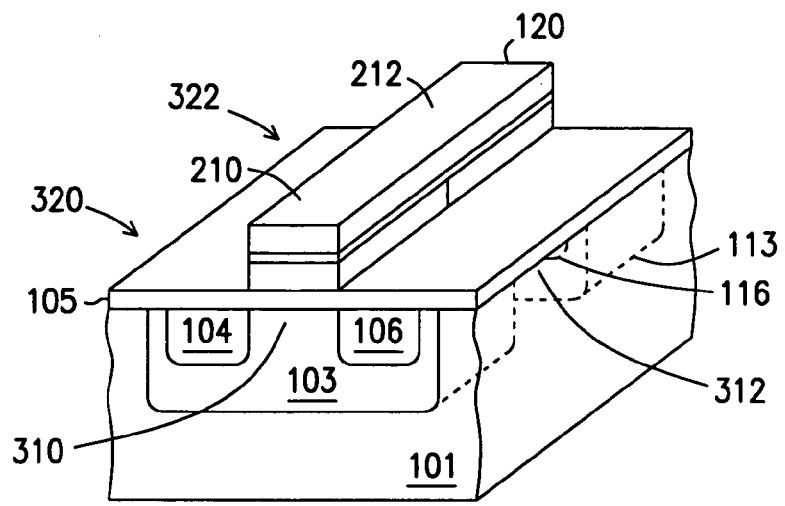
FIG. 3 is an isometric view of the device of FIG. 2.

FIG. 3 is an isometric view of the device of FIG. 1. In FIG. 3, device 100 has a first channel region 310 separating doped regions 104 and 106, and a second channel region 312 separating doped regions 114 and 116. Gate portion 210 and doped regions 104 and 106 form a gate, a source, and a drain of a first transistor 320. Gate portion 212 and doped regions 114 and 116 form a gate, a drain, and a source of a second transistor 322. Transistors 320 and 322 share gate structure 120. Thus, gate structure 120 is a shared gate structure. Some other elements of device 100 such as spacers around the edges of gate structure 120 are omitted for clarity.

Well 103 includes P-type material and well 113 includes N-type material. Doped regions 104 and 106 include N-type material. Doped regions 114 and 116 include P-type material. Thus, transistor 320 is a p-channel transistor and transistor 322 is an n-channel transistor.

Transistors 320 and 322 can form an inverter by adding an interconnection connecting doped regions 106 and 116 (FIG. 1). For simplicity, the interconnection connecting doped regions 106 and 116 is omitted in FIG. 3.

Figure 4:
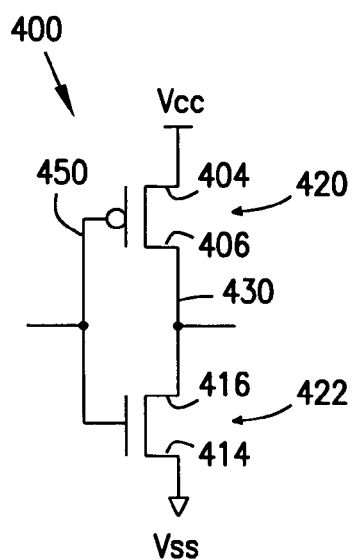
FIG. 4 shows an inverter having a shared gate structure according to an embodiment of the invention.

FIG. 4 is a schematic diagram of an inverter having a shared gate structure according to an embodiment of the invention. Inverter 400 includes a transistor 420 connected to a transistor 422 at an interconnection 430, and a shared gate 450 connected to the gates of both transistors. Transistor 420 has a source 404 and a drain 406. Transistor 422 has a source 414 and a drain 416. Transistors 420 and 422 of FIG. 4 have structures similar to the structure of transistors 320 and 322 of FIG. 3. Shared gate 450 of FIG. 4 is similar to gate structure 120 of FIGS. 1–3. Thus, shared gate 450 has a gate layer, a cross diffusion barrier, and an electrode layer similar to that of shared gate 120. In FIG. 4, inverter 400 connects to voltages Vcc and Vss and receives an input signal IN to produce an output signal OUT, which is an inversion of the IN signal.

Figure 5:
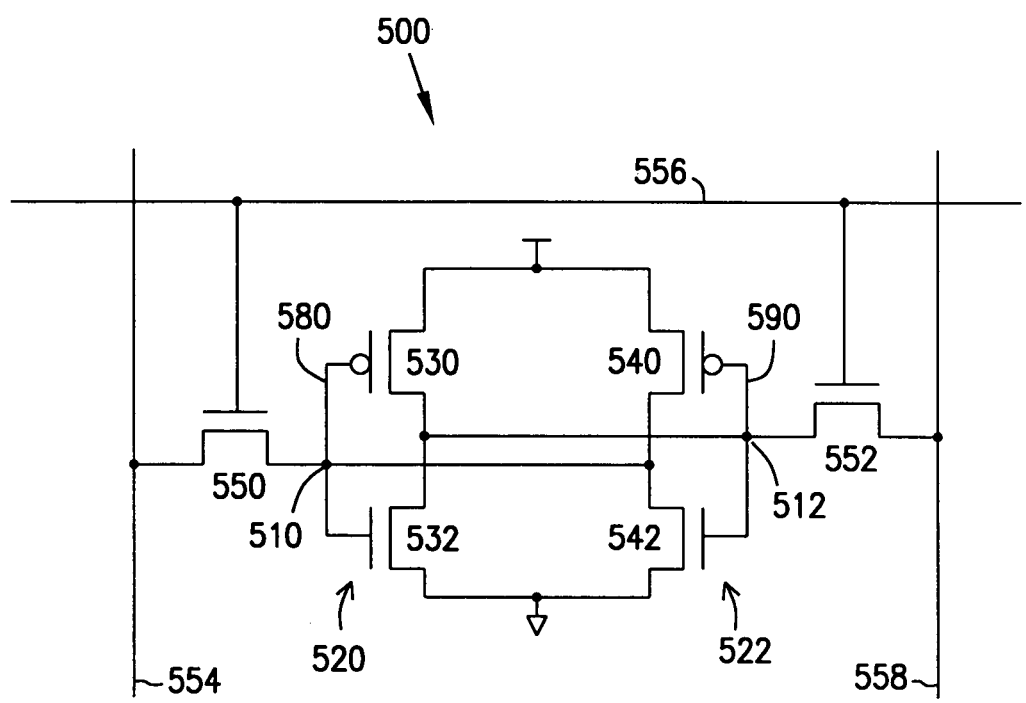
FIG. 5 shows a memory cell according to an embodiment of the invention.

FIG. 5 shows a memory cell according to an embodiment of the invention. Memory cell 500 includes a first inverter 520 cross-coupled with a second inverter 522 at a first storage node 510 and a second storage node 512. Inverter 520 includes transistors 530 and 532. Inverter 522 includes transistors 540 and 542. A first access transistor 550 connects node 510 to a bit line 554 and a word line 556. A second access transistor 552 connects node 512 to a bit line 558 and a word line 556.

Transistors 530 and 532 have a shared gate 580 connected to node 510. Transistors 540 and 542 have a shared gate 590 connected to node 512. Each of the shared gates 580 and 590 has similar construction as that of shared gate 120 of FIGS. 1–3. Thus, each of the shared gates 580 and 590 has a gate layer, a cross diffusion barrier, and an electrode layer similar to that of shared gate 120 of FIGS. 2 and 3.

Memory cell 500 is a static memory cell. Inverters 520 and 522 form a latch to hold data. Memory cell 500 holds the data in complementary forms at storage nodes 510 and 512. For example, when node 510 holds a voltage corresponding to a logic one of the data, node 512 holds a voltage corresponding to a logic zero of the data. In the opposite, when node 510 holds a logic zero, node 512 holds a logic one. Thus, nodes 510 and 512 hold two stable logic states of a data. Either one of the nodes 510 and 512 can be designated to hold the true logic state of the data.

Access transistors 550 and 552 access nodes 510 and 512 during a read operation and a write operation. The read operation reads data from memory cell 500. During a read operation, a voltage is applied to word line 556 to turn on transistors 550 and 552 to connect the voltages on nodes 510 and 512 to bit lines 554 and 558. The difference between the voltages on bit lines 554 and 558 is measured to obtain the true logic state representing the data stored in memory cell 500. During a write operation, complementary voltages representing input logic one and logic zero of a data are applied to bit lines 554 and 558. A voltage is applied to word line 556 to turn on transistors 550 and 552 to connect the voltages on bit lines 554 and 558 to nodes 510 and 512. Inverters 520 and 522 hold the voltages representing the input logic one and logic zero of the data at nodes 510 and 512 as long as power is supplied to memory cell 500.

Device 100, inverter 400, and memory cell 500 can be formed by a method described below.

Figure 6:
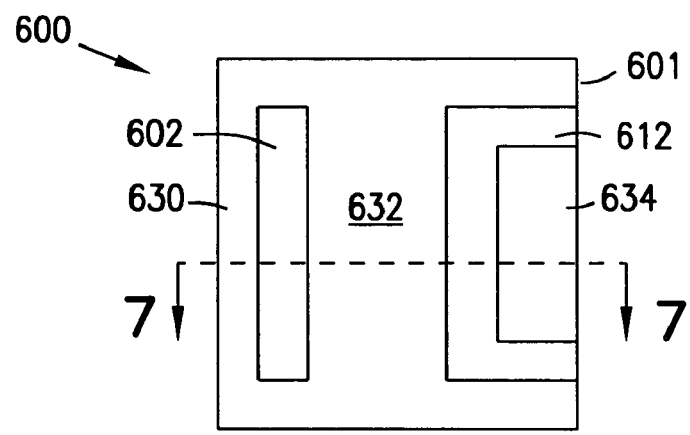
FIGS. 6–20 show various processes of a method of forming a device according to an embodiment of the invention.

FIG. 6 is a top view of a device formed by a method according to an embodiment of the invention. Device 600 includes device areas 602 and 612, and trench isolation regions 630, 632, and 634 formed in a substrate 601. Sources and drains of transistors are formed in device areas 602 and 612 in subsequent processes. Lines 7—7 is a sectional line for a cross-section shown in FIG. 7.

Figure 7:
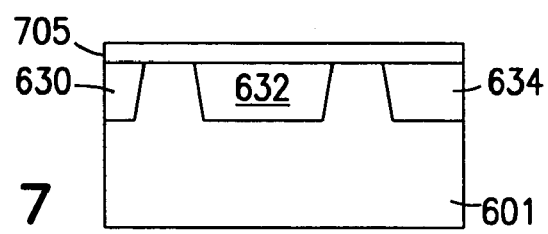
Figure 8:
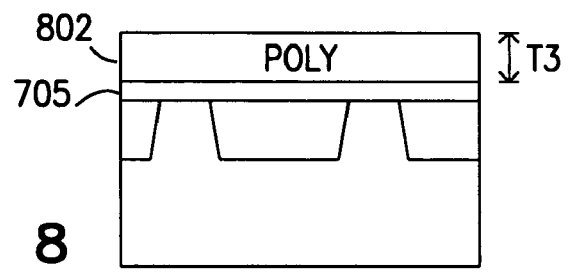

FIG. 7 is a cross-section of the device of FIG. 6 after a formation of a gate insulation layer. In FIG. 7, a gate insulation layer 705 is formed on substrate 601. In FIG. 8, a polysilicon gate layer (POLY) 802 is formed on gate insulation layer 705. Gate layer 802 has a layer thickness T3. In some embodiments, T3 is in a range of about 300 angstroms to about 600 angstroms.

Figure 9:
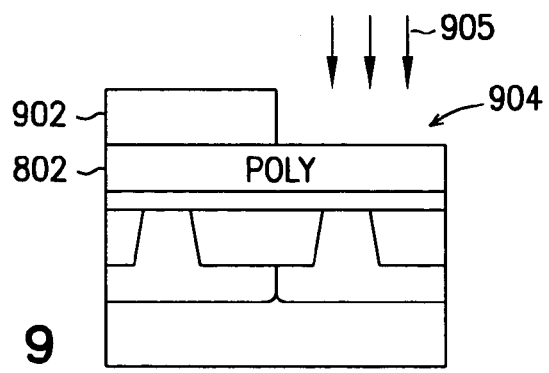
Figure 10:
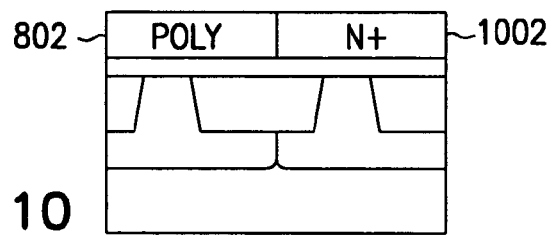

In FIG. 9, a mask or photoresist 902 covers one portion of gate layer 802 leaving an exposed portion 904. A dopant such as phosphorous or arsenic is implanted (arrows 905) into exposed portion 904. In FIG. 10, after the dopant is implanted, gate layer 802 includes a first gate portion 1002 having doped polysilicon of one conductivity type, for example N-type (N+).

Figure 11:
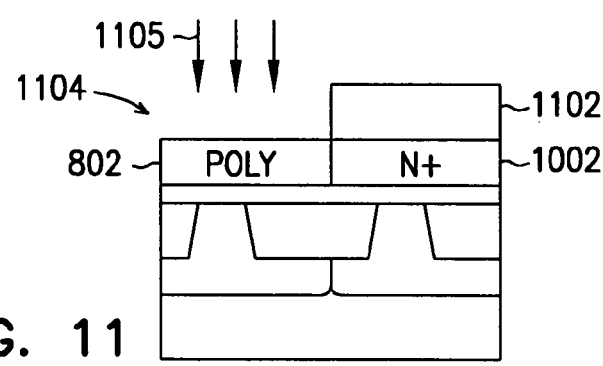
Figure 12:
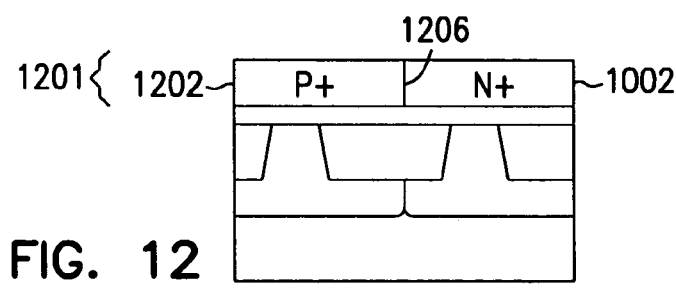

In FIG. 11 a mask or photoresist 1102 covers gate portion 1002 leaving an exposed portion 1104. A dopant such as boron or compounds having boron is implanted (arrows 1105) into exposed portion 1104. In FIG. 12, after the dopant in FIG. 11 is implanted, gate layer 802 become gate layer 1201 which includes a first gate portion 1002 having doped polysilicon of one conductivity type, and a second gate portion 1202 of doped polysilicon of another type, for example P-type (P+). Gate portions 1002 and 1202 join at an junction area 1206.

Figure 13:
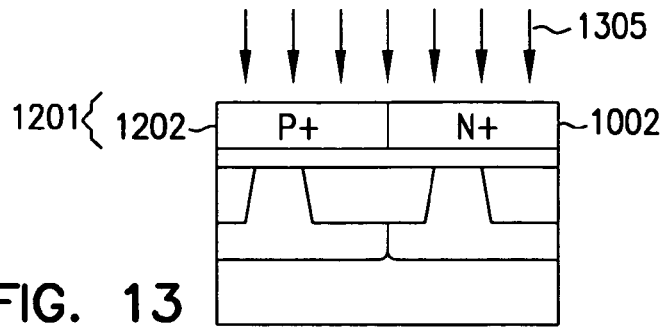

In FIG. 13, nitrogen is introduced (arrows 1305) into the doped polysilicon of gate layer 1201. The nitrogen introduced in this formation can be either elemental nitrogen (N) or molecular nitrogen ($N_2$). The nitrogen can be introduced to gate layer 1201 by a process such as nitrogen implant, rapid thermal processing $NH_3$ anneal, remote plasma nitridization, or inductively coupled $N_2$ plasma treatment.

Figure 14:
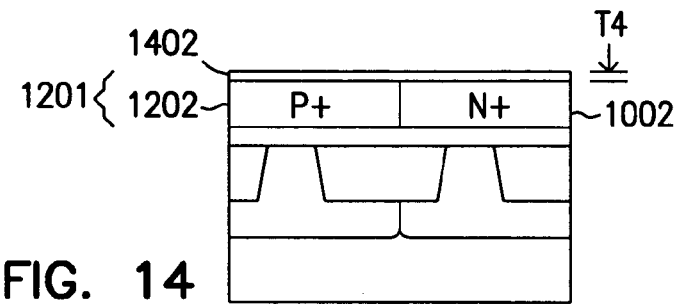

In FIG. 14, a cross diffusion barrier layer 1402 is formed after the dopant in FIG. 13 is implanted into gate 1201. Cross diffusion barrier layer 1402 has a layer thickness T4 adequate to prevents cross diffusion between portions 1002 and 1202 and to cause no substantial increase in the resistance of gate layer 1201. In some embodiments, T4 is in a range of about 5 angstroms to about 10 angstroms. In other embodiments, cross diffusion barrier layer 1402 is a monolayer of single nitrogen atoms.

Figure 15:
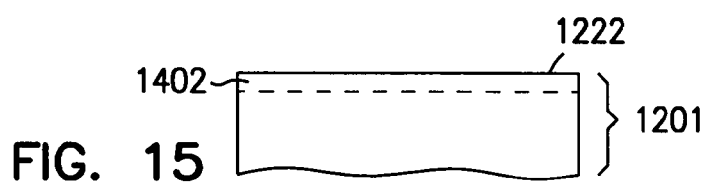

FIG. 15 shows a cross diffusion barrier layer according to an alternative embodiment of the invention. Cross diffusion barrier layer 1402 in this alternative embodiment is an integral part of gate layer 1201 and is located immediately below a top surface 1222 of layer 1201.

In some embodiments, cross diffusion barrier layer 1402 is formed by a remote plasma nitridization (RPN) process. In this RPN process, nitrogen plasma is created on the surface of gate layer 1201. Silicon on the top surface of gate layer 1201 reacts with the nitrogen and forms cross diffusion barrier layer 1402 layer having a combination of silicon and nitrogen. In this process, cross diffusion barrier layer 402 is formed immediately below the top surface of gate layer 1201.

In some embodiments, cross diffusion barrier layer 1402 includes silicon nitride ($Si_3N_4$). In other embodiments, cross diffusion barrier layer 1402 has about 80 percent of silicon and about 20 percent of nitrogen. In some other embodiments, the concentration of nitrogen in cross diffusion barrier layer 1402 is in a range of about 10 percent to about 40 percent of nitrogen.

In some embodiments, the introduction of nitrogen into gate layer 1201 is performed with a nitrogen plasma at a pressure of about 10 milliTorr, an RF (radio frequency) power in a range of about 500 watts to about 1500 watts, a nitrogen gas flow of about 250 scc, a temperature range of about 350 to about 400 degrees Celsius, and a duration in a range of about 20 seconds to about 100 seconds.

In other embodiments, the introduction of nitrogen into gate layer 1201 is performed with a nitrogen plasma at a pressure of about 7 milliTorr, an RF power of about 900 watts, a nitrogen gas flow of about 250 scc, a temperature range of about 100 to 200 degrees Celsius, and a duration of about 40 seconds.

Since cross diffusion barrier layer 1402 having nitrogen is formed by adding nitrogen into gate layer 1201, the doped polysilicon in gate layer 1201 suffers insignificant depletion (or loss) of dopant, thereby preserving the original material structure of gate layer 1201. In addition, by adding nitrogen to gate layer 1201 to form cross diffusion barrier layer 1402, the thickness of layer 1402 can be accurately obtained by controlling the amount of nitrogen before it is introduced into gate layer 1201. Moreover, since nitrogen is introduced into gate layer 1201 from an external source, the concentration of nitrogen in cross diffusion barrier layer 1402 can be controlled. Further, cross diffusion barrier layer 1402 created by the combination of silicon and nitrogen causes insignificant or no insulation effect, thereby reducing or eliminating parasitic capacitance when cross diffusion barrier layer 1402 is sandwiched between gate layer 1201 and another conductive layer.

Figure 16:
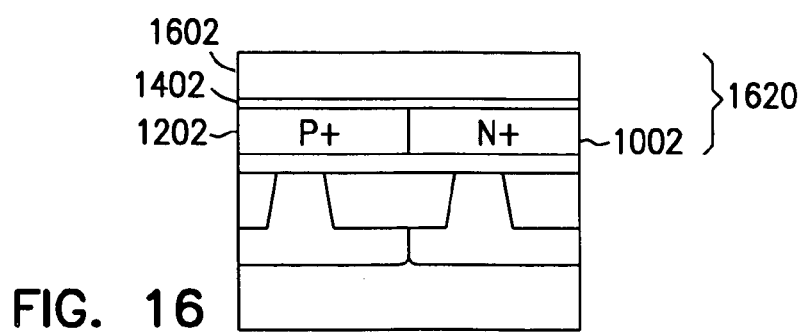

In FIG. 16, an electrode layer 1602 is formed on cross diffusion barrier layer 1402. Layers 1602, 1402, and 1201 form a gate structure 1620 corresponding to gate structure 120 (FIGS. 1–3). In FIG. 16, electrode layer 1602 includes material selected from the group of a combination of tungsten and silicon ($WSi_2$) or tungsten silicide, a combination of titanium and silicon ($TiSi_2$) or titanium silicide, and a combination of tungsten and nitrogen or tungsten nitride (WN). In other embodiments, electrode layer 1602 includes other conductive materials.

Cross diffusion barrier layer 1402 has a low resistance. Therefore, when additional contact or conductive layer, such as electrode layer 1602, is to formed, layer 1402 contributes substantial insignificant resistance to the total resistance of the gate structure 1620.

Figure 17:
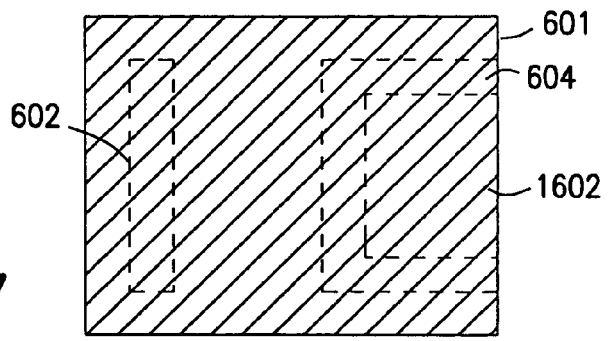

FIG. 17 is a top view of FIG. 16. In FIG. 17, electrode layer 1602 is on top of other layers with device areas 602 and 604 showed below as dashed line. From this point, a device such as transistor, inverter, or memory cell can be formed.

Figure 18:
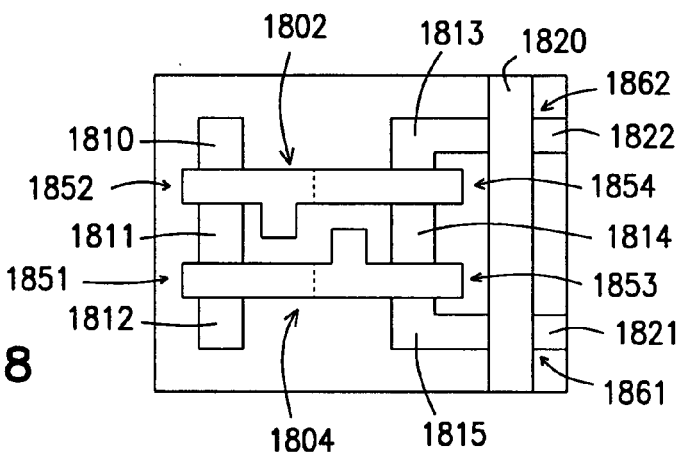

FIG. 18 shows the device of FIG. 17 after a gate patterning process. The gate patterning process defines gate structures 1802 and 1804 with each having doped polysilicon layer, a cross diffusion barrier layer, and an electrode layer as shown in FIG. 16. After gate structures 1802 and 1804 are formed, source regions and drain regions are formed in regions 1810–1815 by implanting dopants into these regions. Spacers (not shown) are also formed around the edges of gated structures 1802 and 1804. Source regions and drain regions 1810–1815, and gate structures 1802 and 1804 form transistors 1851, 1852, 1853 and 1854. Additional transistors are also formed. For example, source and drain regions 1822 and 1821 and gate 1820 form other transistors 1861 and 1862.

Figure 19:
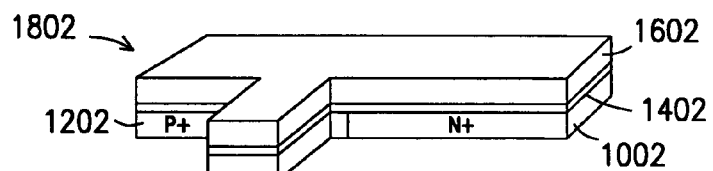

FIG. 19 is an isometric view one of the gate structures of FIG. 18. As shown in FIG. 19, gate structure 1802 includes doped polysilicon layer having first and second portions 1002 and 1202, a cross diffusion barrier layer 1402, and an electrode layer 1602. These layers correspond to that of FIG. 16.

Figure 20:
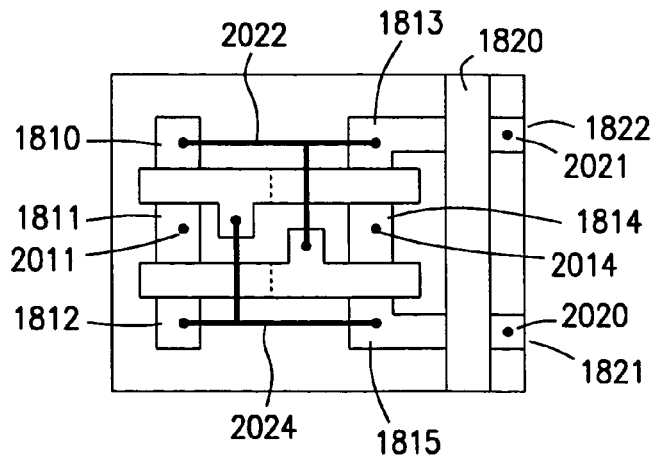

FIG. 20 is a top view of the device after a formation of interconnections. Interconnection 2022 connects gate structure 1804 with regions 1810 and 1813. Interconnection 2024 connects gate structure 1802 with regions 1812 and 1815.Other interconnections connect to other external elements.

Figure 21:
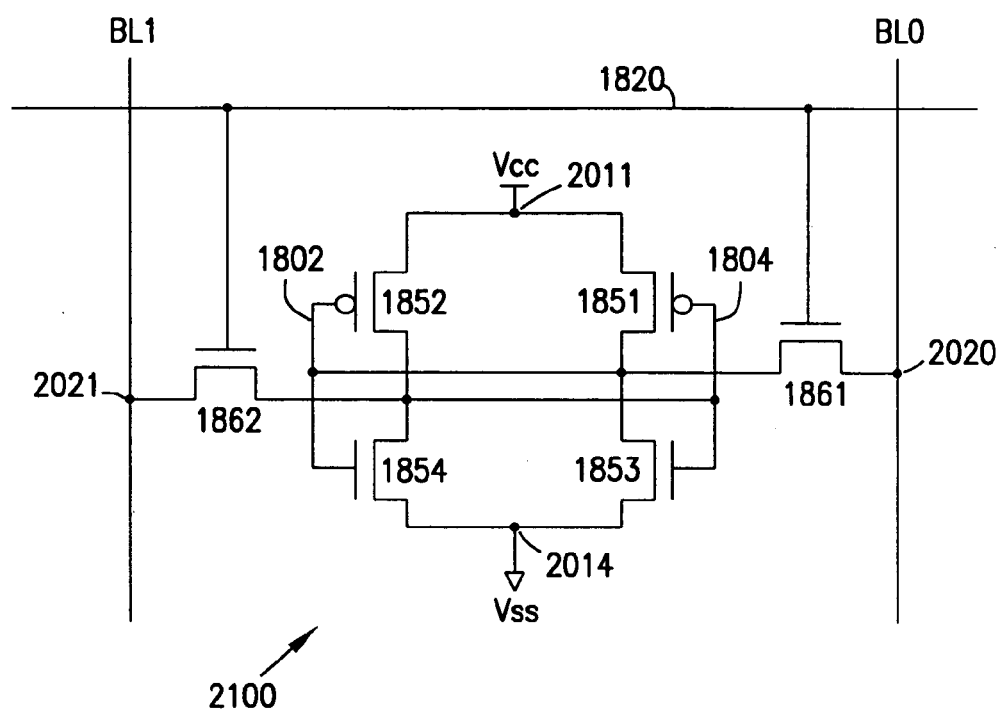
FIG. 21 is a schematic diagram of the device of FIG. 20.

For example, interconnections 2011 and 2014 can connect to supply sources Vcc and Vss (FIG. 21), interconnections 2020 and 2021 connect to external bit lines BL0 and BL1 (FIG. 21).

FIG. 21 is a schematic diagram of the device of FIG. 20. Device 2100 can be used as a static memory cell.

Figure 22:
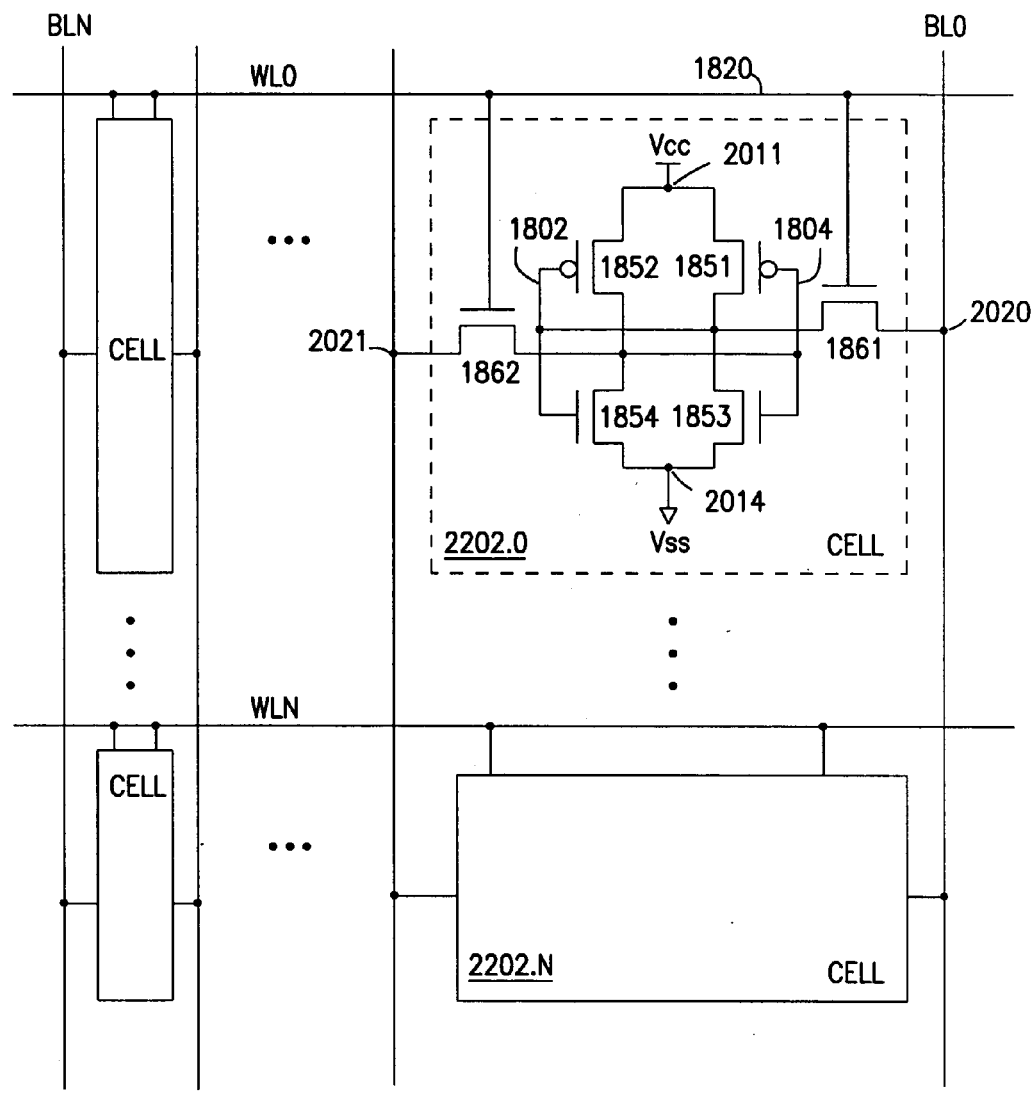
FIG. 22 is a schematic diagram of a memory array according to an embodiment of the invention.

FIG. 22 is a schematic diagram of a memory array according to an embodiment of the invention. Memory array 2200 includes a plurality of the memory cells 2202.0 to 2202.N arranged in rows and columns along with a plurality of word lines WL0–WLN and bit lines BL0–BLN. For simplicity, FIG. 22 only shows details of memory cell 2202.0. Memory cell 2202.N and other memory cells have similar elements as the elements of memory cell 2202.0. Each of the memory cells 2202.0 to 2202.N is formed in a similar manner as that of memory cell 2100 (FIG. 21). Thus, each of the memory cells 2202.0 to 2202.N has a gate structure similar to gate structure 1620 (FIG. 16).

Figure 23:
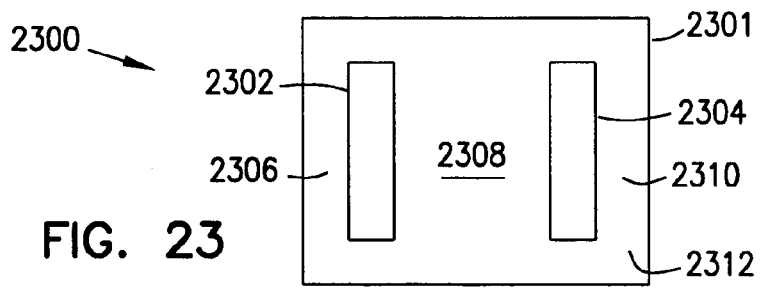
FIGS. 23–26 show various processes of a method of forming another device according to an alternative embodiment of the invention.

FIG. 23 is a top view of another device formed by a method according to an alternative embodiment of the invention. Device 2300 includes device areas 2302 and 2304, trench isolation regions 2306, 2308, and 2310, and a gate isolation layer 2312, all formed in a substrate 2301.

Figure 24:
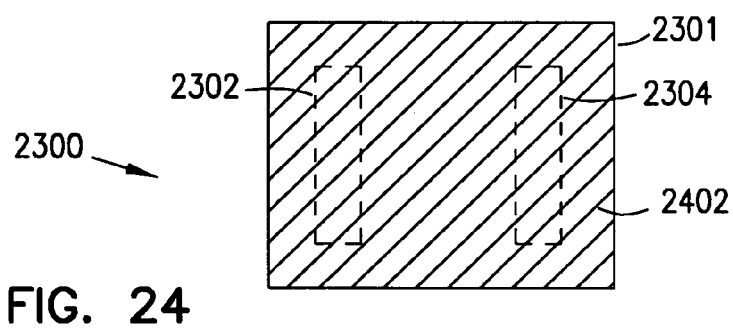

FIG. 24 is a top view of the device of FIG. 23 after a formation of a doped polysilicon gate layer, a cross diffusion barrier layer, and an electrode layer. These layers are formed in similar method described in FIGS. 6–18. FIG. 24 shows the device similar to the device of FIG. 17. FIG. 24 shows electrode layer 2402 being on top of other layers with device areas 2302 and 2304 shown below as dashed line.

Figure 25:
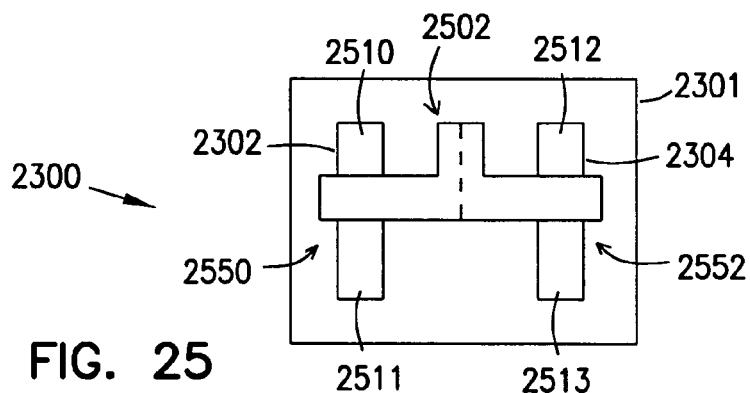

FIG. 25 shows the device of FIG. 24 after a gate patterning process. The gate patterning process defines a gate structure 2502 having doped polysilicon layer, a cross diffusion barrier layer, and an electrode layer similar to that of FIG. 16. After gate structure 2502 is formed, source regions and drain regions are formed in regions 2510–2513. Source regions and drain regions 2510–2513 and gate structure 2502 form transistors 2550 and 2552.

Figure 26:
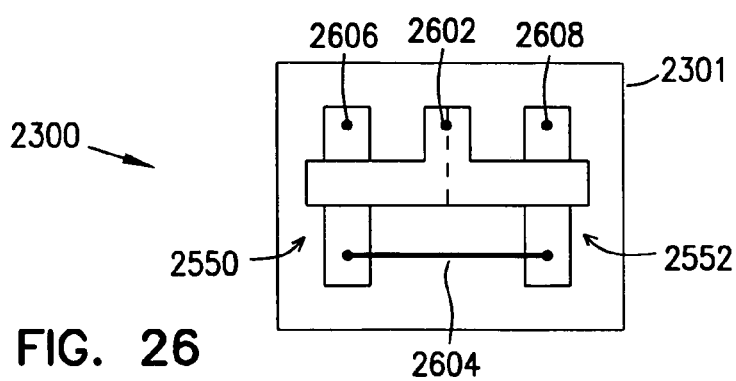

FIG. 26 shows the device of FIG. 25 after a formation of interconnections. Interconnection 2602 connects gate structure 2502 to a future input node. Interconnection 2604 connects region 2511 to region 2513. Other interconnections connect to other external elements. For example, interconnections 2606 and 2608 can connect to supply sources Vcc and Vss (FIG. 27).

Figure 27:
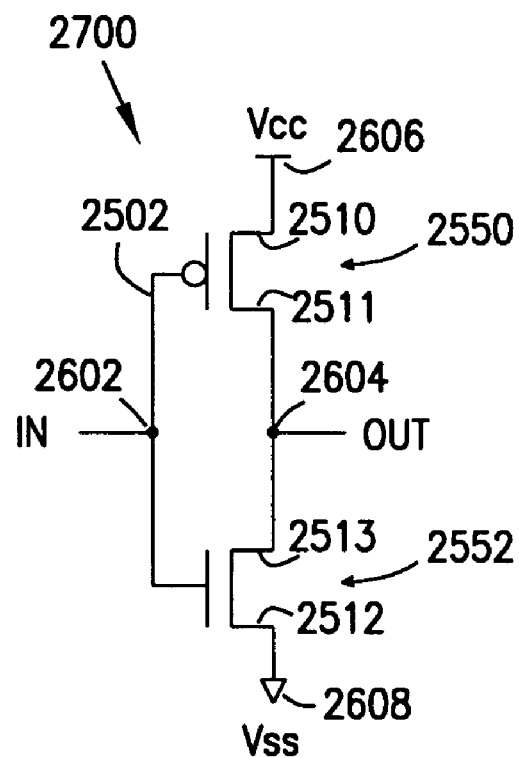
FIG. 27 is a schematic diagram of the device of FIG. 25.

FIG. 27 is a schematic diagram of the device of FIG. 25. Device 2700 can be used to perform an inversion function. In some embodiments, device 2600 is a CMOS inverter.

Figure 28:
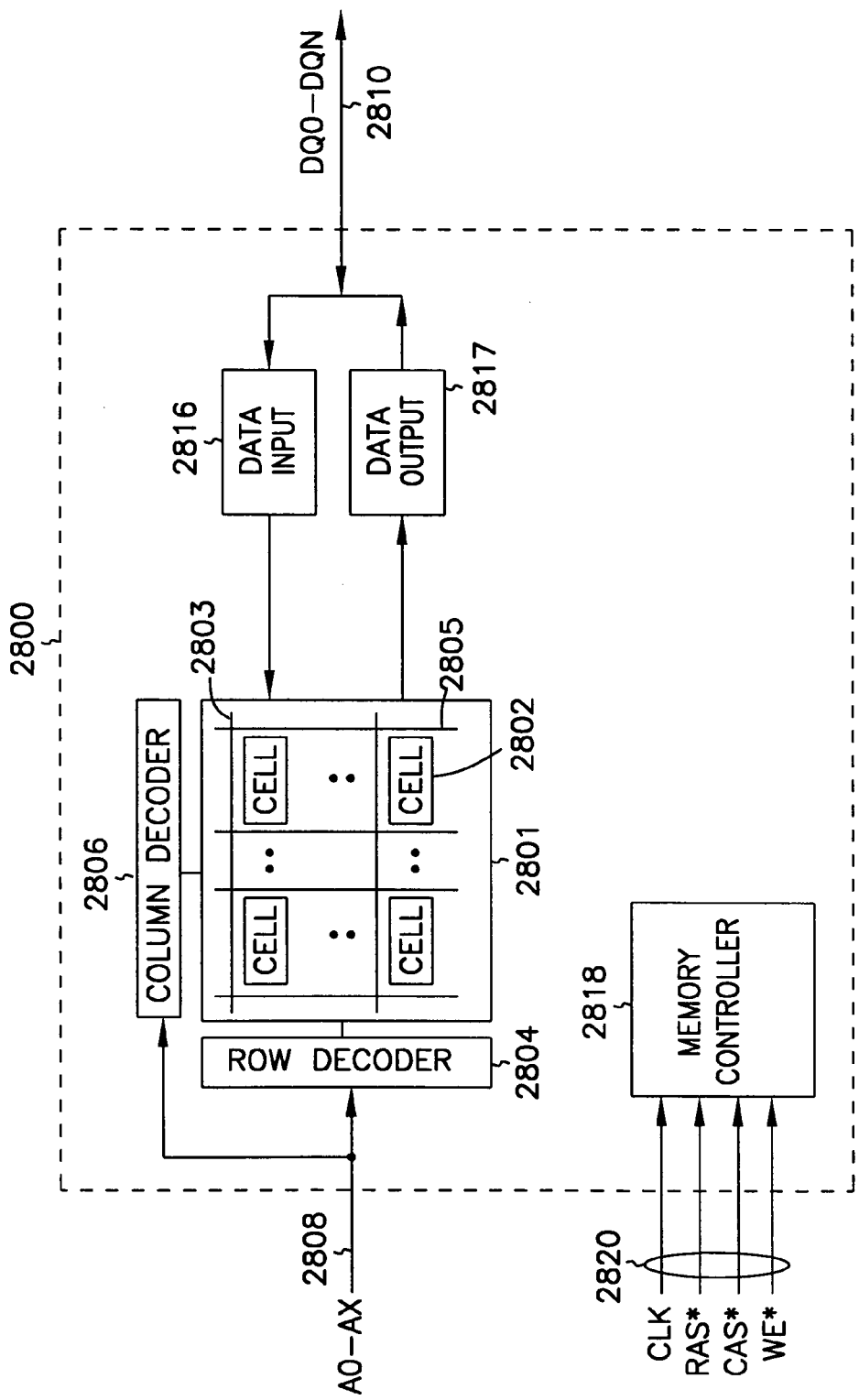
FIG. 28 shows a memory device according to an embodiment of the invention.

FIG. 28 shows a memory device according to an embodiment of the invention. Memory device 2800 includes a memory array 2801 having plurality of memory cells 2802 and arranged in rows and columns along with word lines 2803 and bit lines 2805. Row and column decoders 2804 and 2806 provide access to memory cells 2802 in response to address signals A0–AX on address lines (or address bus) 2808. A data input circuit 2816 and data output circuit 2817 transfer data between memory cells 2802 and data lines (or data bus) 2810. Data lines 2810 carry data signals DQ0–DQN. A memory controller 2818 controls the operations of memory device 2800 based on control signals on control input lines 2820. Examples of control signals include a clock signal CLK, a row access strobe signal RAS*, a column access strobe CAS* signal, and a write enable signal WE*. Memory device 2800 is an integrated circuit and includes other circuit elements. For simplicity, the other circuit element are omitted from FIG. 28.

Memory array 2801 corresponds to memory array 2200 (FIG. 22) and each of the memory cells 2802 include embodiments of memory cells described in this specification. For example, memory cells 2802 can include embodiments of memory cell 500 (FIG. 5) or memory cell 2100 (FIG. 28). Thus, memory cells 2802 have gate structures such as gate structure 120 and (FIGS. 1 and 2) and gate structure 1620 (FIG. 16). Each of these gate structures has a cross diffusion barrier layer to prevent a dopant from a doped polysilicon of first conductivity type to diffuse to a doped polysilicon of second conductivity type.

Figure 29:
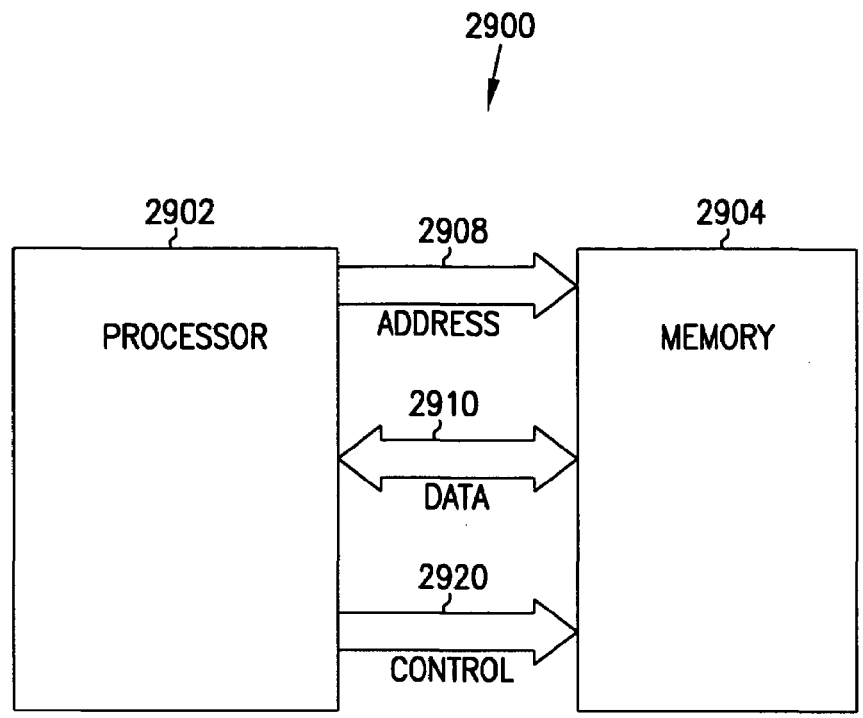
FIG. 29 shows a system according to an embodiment of the invention.

FIG. 29 shows a system according to an embodiment of the invention. System 2900 includes a first integrated circuit (IC) 2902 and a second IC 2904. ICs 2902 and 2904 can include processors, controllers, memory devices, application specific integrated circuits, and other types of integrated circuits. In embodiments represented by FIG. 29, for example, IC 2902 represents a processor, and IC 2902 represents a memory device. Processor 2902 and memory device 2904 communicate using address signals on lines 2908, data signals on lines 2910, and control signals on lines 2920.

Memory device 2904 can be memory device 2800 of FIG. 28. In some embodiments, memory device 2904 includes a plurality of memory cells which include gate structures having cross diffusion barrier layers to prevent a dopant from a doped polysilicon of first conductivity type to diffuse to a doped polysilicon of second conductivity type. These memory cells and gates structures are formed by methods described in this specification.

System 2900 represented by FIG. 29 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention describe structures and methods for providing an adequate prevention of cross diffusion in polysilicon gates without substantially increasing the resistance of the polysilicon gates. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. An integrated circuit comprising:
   a plurality of bit lines and a plurality of word lines; and
   a plurality of memory cells connected to the bit lines and the word lines, each of the memory cells including:
      a first inverter connected to a second ionverter at a srorage node and a second storge node, each of the first and second inverters including;
      a first transistor connected to a second transistor, the first and second transistor including a shared gate structure, the shared gate structure including:
         a polysilicon layer including a first gate portion of first conductivity type, and a second gate portion of second conductivity type, wherein a source of the first transistor and drain of the second transistor are located on a first side of the polysilicon layer, wherein a drain of the first transistor and a source of the second transistor are located on a second side of the polysilicon layer, and wherein the polysilicon layer includes a segment located between the source of the first transistor and the drain of the second transistor for coupling to one of a source and a drain of a third transistor;

an electrode layer; and a cross diffusion barrier layer sandwiched between the electrode layer and the polysilicon layer, the cross diffusion barrier layer is being formed to below a top surface of the polysilicon layer, wherein the cross diffusion barrier layer is formed to prevent cross diffusion between the first gate portion and the second gate portion, and wherein the cross diffusion barrier layer has a thickness of about one percent of a thickness of the gate layer; and a pair of access devices controlled by one of the word lines and connected to the first and second storage nodes and to a pair of bit lines among the plurality of bit lines.

2. The integrated circuit of claim 1, wherein the cross diffusion barrier layer includes nitrogen.

3. The integrated circuit of claim 1, wherein the cross diffusion barrier layer includes silicon nitride.

4. The integrated circuit of claim 1, wherein the cross diffusion barrier layer has a thickness in a range of about 5 angstroms to about 10 angstroms.

5. A system comprising:

a processor; and a memory device connected to the processor, the memory device including a plurality of memory cells connected to a plurality of bit lines and a plurality of word lines, each of the memory cells including:

a first inverter connected to a second inverter at a first storage node and a second storage node, each of the first and second inverters including:

a first transistor connected to a second transistor, the first and second transistors including a shared gate structure, the shared gate structure including:

a polysilicon layer including a first gate portion of first conductivity type, and a second gate portion of second conductivity type, wherein a source of the first transistor and a drain of the second transistor are located on a first side of the polysilicon layer, wherein a drain of the first transistor and a source of the second transistor are located an a second side of the polysilicon layer, and wherein the polysilicon layer includes a segment located between the source of the first transistor and the drain of the second transistor coupling to one of a source and a drain of a third transistor;

an electrode layer; and a cross diffusion barrier layer sandwiched between the electrode layer and the polysilicon layer, the cross diffusion barrier layer being formed below a top surface of the polysilicon layer, wherein the cross diffusion barrier layer is formed below to prevent cross diffusion between the first gate portion and the second gate portion, and wherein the cross diffusion barrier layer has a thickness of about one percent of a thickness of the gate; and a pair of access devices controlled by one of the word lines and connected to the first and second storage nodes and to a pair of bit lines among the plurality of bit lines.

6. The system of claim 5, wherein the cross diffusion barrier layer includes nitrogen.

7. The system of claim 5, wherein the cross diffusion barrier layer includes silicon nitride.

8. The system of claim 5, wherein the cross diffusion barrier layer has a thickness of about 5 angstroms to about 10 angstroms.

9. A device comprising:

a substrate having doped regions, the doped regions including a first doped region and a second doped region located on a first side of the substrate, and a third doped region and a fourth doped region located on a second side of the substrate;

a gate layer opposing the doped regions and separated from the substrate by a gate insulation layer, the gate layer including a first gate portion of first conductivity type, and a second gate portion of second conductivity type joining the first gate portion, wherein the first and third doped regions are located on a first side of the gate layer, wherein the second and fourth doped regions are located on the second side of the gate layer, wherein the first and third doped regions are source and drain regions of a first transistor, wherein the second and fourth doped regions are source and drain regions of a second transistor, and wherein the gate layer includes a gate segment located between the first and third doped regions for coupling to one of a source and drain of a third transistor;

a cross diffusion barrier layer contacting and spreading across at least a portion of the first and second gate portions, the cross diffusion barrier layer being formed below a top surface of the gate layer, wherein the cross diffusion barrier layer is formed below to prevent cross diffusion between the first gate portion and the second gate portion, and wherein the cross diffusion barrier layer has a thickness of about one percent of a thickness of the gate layer; and an electrode layer contacting the cross diffusion barrier layer.

10. The device of claim 1, wherein the cross diffusion barrier layer includes nitrogen.

11. The device of claim 1, wherein the cross diffusion barrier layer includes silicon nitride.

12. The device of claim 1, wherein the cross diffusion barrier layer has a thickness in a range of about 5 angstroms to about 10 angstroms.

13. The device of claim 1, wherein the cross diffusion barrier layer has a concentration in a range of about 10 percent to about 40 percent of nitrogen.

14. The device of claim 1, wherein the dopants of a first type and the dopant of a second type are selected from the group consisting of arsenic, phosphorus, boron.

15. The device of claim 1, wherein the electrode layer includes one of the following materials: tungsten silicide, titanium suicide, and tungsten nitride.

16. A device comprising:

a first transistor of a first type;

a second transistor of a second type connected to the first transistor, each of the first and second transistors including a channel region separating a source and a drain inside a substrate, the first and second transistors including a shared gate structure separated from the substrate by a gate insulation layer, the shared gate structure including:

a polysilicon layer including a first gate portion of first conductivity type opposing the channel of the first transistor, and a second gate portion of second conductivity type opposing the channel of the second transistor, wherein the source of the first transistor and the drain of the second transistor and the source of the second transistor are located on a second side of the polysilicon layer, and wherein the polysilicon layer includes a segment located between the source of the first transistor and the drain of the second transistor for coupling to one of a source and a drain of a third transistor;

an electrode layer; and a cross diffusion barrier layer sandwiched between the electrode layer and the polysilicon layer, the cross diffusion barrier layer being formed below a top surface of the polysilicon layer, wherein the cross diffusion barrier layer is formed to prevent cross diffusion between the first gate portion and the second gate portion, and wherein the cross diffusion barrier layer has a thickness of about one percent of a thickness of the gate layer.

17. The device of claim 16, wherein the cross diffusion barrier layer includes nitrogen.

18. The device of claim 16, wherein the cross diffusion barrier layer includes silicon nitride.

19. The device of claim 16, wherein the cross diffusion barrier layer has a thickness in a range of about 5 angstroms to about 10 angstroms.

20. The device of claim 16, wherein the first transistor is a p-channel transistor.

21. The device of claim 20, wherein the second transistor is an n-channel transistor.

22. A memory cell comprising:

a first inverter connected to a second inverter at a first storage node and at a second storage node, each of the first and second inverters including:

a first transistor connected to a second transistor, the first and second transistor including a shared gate structure, the shared gate structure including:

a polysilicon layer including a first gate portion of first conductivity type, and a second gate portion of second conductivity type, wherein a source of the first transistor and a drain of the second transistor are located on the first side of the polysilicon layer, wherein a drain of the first transistor and a source of the second transistor are located on a second side of the polysilicon layer, and wherein the polysilicon layer includes a segment located between the source of the first transistor and the drain of the second transistor for coupling to one of a source and a drain of a third transistor;

an electrode layer; and a cross diffusion barrier layer sandwiched between the electrode layer and the polysilicon layer, the cross diffusion barrier being formed below the top surface of the polysilicon layer, wherein the cross diffusion barrier layer is adapted to prevent cross diffusion between the first gate portion and the second gate portion, and wherein the cross diffusion barrier layer has a thickness of about one percent of a thickness of the gate layer; and a pair of access devices connected to the first and second storage nodes.

23. The memory cell of claim 22, wherein the cross diffusion barrier layer includes nitrogen.

24. The memory cell of claim 22, wherein the cross diffusion barrier layer includes silicon nitride.

25. The memory cell of claim 22, wherein the cross diffusion barrier layer has a thickness in a range of about 5 angstroms to about 10 angstroms.

26. The memory cell of claim 22, wherein:

the first inverter includes an input connected to the first storage node and an output connected to the second storage node; and the second inverter includes an input connected to the second storage node and an output connected to the first storage node.

27. The memory cell of claim 26, wherein the pair of access devices includes:

a first transistor including a source connected to the first storage node, a drain connected to a first bit line, and a gate connected to a word line; and a second transistor including a source connected to the second storage node, a drain connected to a second bit line, and a gate connected to the word line.

28. The memory cell of claim 22, wherein the first transistor is a p-channel transistor.

29. The memory cell of claim 28, wherein the second transistor is an n-channel transistor.

30. A device comprising:

a substrate including a first device area having a first doped region, a second doped region, and a first channel region separating the first and second doped regions, and a second device area having a third doped region, a fourth doped region, and a second channel region separating the third and fourth doped regions, wherein the first and third doped regions are located on a first side of the substrate, and wherein the second and the fourth doped regions are located on a second side of the substrate;

a gate layer separated from the substrate by a gate insulation layer, the gate layer including a first gate portion of first conductivity type opposing the first channel region, and a second gate portion of second conductivity type opposing the second channel region, wherein the first and third doped regions are located in the first side of the gate layer, wherein the second and fourth doped regions are located on a second side of the gate layer, wherein the first and third doped region are source and drain regions of a first transistor, wherein the second and fourth doped regions are source and drain regions of a second transistor, and wherein the gate layer includes a gate segment located between the first and third doped regions for coupling to one of a source and drain of a third transistor;

a cross diffusion barrier layer including a first surface contacting and spreading across the first and second gate portions, the cross diffusion barrier layer being formed below a top surface of the gate layer, wherein the cross diffusion barrier layer is formed to prevent cross diffusion between the first gate portion and the second gate portion, and wherein the cross diffusion barrier layer has a thickness of about one percent of a thickness of the gate; and an electrode layer contacting a second surface of the cross diffusion barrier layer.

31. The device of claim 30, wherein the cross diffusion barrier layer includes nitrogen.

32. The device of claim 30, wherein the cross diffusion barrier layer includes silicon nitride.

33. The device of claim 30, wherein the cross diffusion barrier layer has a thickness in a range of about 5 angstroms to about 10 angstroms.

34. The device of claim 30, wherein the first and second doped regions include material of a first conductivity type and the third and fourth doped regions include material of a second conductivity type.

35. The device of claim 30, wherein the first device area includes a first well encompassing the first and second doped regions.

36. The device of claim 35, wherein the second device area includes a second well encompassing the third and fourth doped regions.

37. The device of claim 36, wherein the first well includes material of a first conductivity type and the second well includes material of second conductivity type.

38. A memory device comprising:
a semiconductor substrate including a first doped region and a second doped region located on a first side of the semiconductor substrate, and a third doped region and a fourth doped region located on a second side of the semiconductor substrate;
a gate layer separated from the semiconductor substrate by a gate insulation layer, the gate layer including a first gate portion of first conductivity type, and a second gate portion of second conductivity type joining the first gate portion, wherein the first and third doped regions are located on a first side of the gate layer, wherein the second and fourth doped regions are located on a second side of the gate layer, wherein the first and third regions are source and drain regions of a first transistor, wherein the second and fourth doped regions are source and drain regions of a second transistor, and wherein the gate layer includes a gate segment located between the first and third doped regions for coupling to one of a source and drain of a third transistor;
an electrode layer including nitrogen; and
a cross diffusion barrier layer formed between the gate layer and the transistor gate electrode layer and spreading across at least a portion of the first and second gate portion, the cross diffusion barrier layer being formed below a top surface of the gate layer, wherein the cross diffusion barrier is adapted to prevent cross diffusion between the first gate portion and the second gate portion, and wherein the cross diffusion barrier layer has a thickness of about one percent of the thickness of the gate layer to prevent the cross diffusion between the first gate portion and the second gate portion without substantially increasing a resistance of the gate.

39. The memory device of claim 38, wherein the cross diffusion barrier layer has a thickness in range of about 5 angstroms to about 10 angstroms.

40. The memory device of claim 38, wherein the electrode layer further includes tungsten combined with the nitrogen.

41. The memory device of claim 40, wherein the cross diffusion barrier layer includes nitrogen.

42. The memory devise of claim 41, wherein the gate layer has a thickness of about 400 angstroms to about 600 angstroms.

43. The memory device of claim 41, wherein the cross diffusion barrier layer further includes silicon combined with the nitrogen.

44. A memory device comprising:
a substrate including s first doped region and a second doped region located an a first side of the substrate, and a third doped region and a fourth doped region located on a second side of the substrate;
a gate layer separated from the substrate by a gate insulation layer, the layer including the first gate portion of first conductivity type, a second gate portion of second conductivity type joining the first gate portion, and a top surface, wherein the first and third doped regions are located an a first side of the gate layer, wherein the second and fourth doped regions are located on a second side of the gate layer, wherein the first and third doped regions are source and drain regions of a first transistor, wherein the second and fourth doped regions are source and drain regions of a second transistor, and wherein the gate layer includes a gate segment located between the first and third doped regions for coupling to one of a source and a drain of a third transistor;
an electrode layer; and
a cross diffusion barrier layer formed between the gate layer and the electrode layer and spreading across at least a portion of the first and second gate portions, the cross diffusion barrier layer including nitrogen, the cross diffusion barrier layer formed below the top surface of the gate layer, wherein the cross diffusion layer is adapted to prevent cross diffusion between the first gate portion and the second gate portion, and wherein the cross diffusion barrier layer has a thickness in a range of about 5 angstroms to about 10 angstroms to prevent the cross diffusion between the first gate portion and the second gate portion without substantially increasing a resistance of the gate layer.

45. The memory devise of claim 44, wherein the cross diffusion barrier layer further includes silicon combined with the nitrogen.

46. The memory device of claim 45, wherein the silicon of the cross diffusion barrier layer is part of a silicon material of the gate layer.

47. The memory device of claim 46, wherein the electrode layer includes tungsten.

48. The memory device of claim 47, wherein the electrode layer further includes nitrogen combined with the tungsten.

49. The memory device of claim 48, wherein the cross diffusion barrier layer has a thickness of about one percent of a thickness of the gate layer.

* * * * *

UNITED STATES PATENT AND TRADEMARK OFFICE
CERTIFICATE OF CORRECTION

PATENT NO. : 7,166,896 B2
APPLICATION NO. : 10/228839
DATED : January 23, 2007
INVENTOR(S) : Tang et al.

It is certified that error appears in the above-identified patent and that said Letters Patent is hereby corrected as shown below:

In column 6, line 66, delete "1815.Other" and insert -- 1815. Other --, therefor.

In column 8, lines 59-60, in Claim 1, delete "ionverter at a srorage" and insert -- inverter at a first storage --, therefor.

In column 8, line 60, in Claim 1, delete "storge" and insert -- storage --, therefor.

In column 8, line 61, in Claim 1, after "including" delete ";" and insert -- : --, therefor.

In column 8, line 63, in Claim 1, delete "transistor" and insert -- transistors --, therefor.

In column 9, line 1, in Claim 1, after "and" insert -- a --.

In column 9, line 13, in Claim 1, delete "is being formed to" and insert -- being formed --, therefor.

In column 9, line 51, in Claim 5, delete "an" and insert -- on --, therefor.

In column 9, line 55, in Claim 5, after "transistor" insert -- for --.

In column 9, line 63, in Claim 5, after "formed" delete "below".

In column 9, line 67, in Claim 5, after "gate" insert -- layer --.

In column 10, line 26, in Claim 9, delete "on the" and insert -- on a --, therefor.

In column 10, line 32, in Claim 9, after "and" insert -- a --.

In column 10, line 38, in Claim 9, after "formed" delete "below".

In column 10, line 45, in Claim 10, delete "1" and insert -- 9 --, therefor.

UNITED STATES PATENT AND TRADEMARK OFFICE
CERTIFICATE OF CORRECTION

PATENT NO.        : 7,166,896 B2
APPLICATION NO.   : 10/228839
DATED             : January 23, 2007
INVENTOR(S)       : Tang et al.

It is certified that error appears in the above-identified patent and that said Letters Patent is hereby corrected as shown below:

In column 10, line 47, in Claim 11, delete "1" and insert -- 9 --, therefor.

In column 10, line 49, in Claim 12, delete "1" and insert -- 9 --, therefor.

In column 10, line 52, in Claim 13, delete "1" and insert -- 9 --, therefor.

In column 10, line 55, in Claim 14, delete "1" and insert -- 9 --, therefor.

In column 10, line 57, in Claim 14, delete "phosphorus" and insert -- phosphorous --, therefor.

In column 10, line 58, in Claim 15, delete "1" and insert -- 9 --, therefor.

In column 10, line 61, in Claim 15, delete "suicide" and insert -- silicide --, therefor.

In column 11, line 9, in Claim 16, after "transistor" insert -- are located on a first side of the polysilicon layer, wherein the drain of the first transistor --.

In column 11, line 49, in Claim 22, delete "on the" and insert -- on a --, therefor.

In column 11, line 61, in Claim 22, after "barrier" insert -- layer --.

In column 11, line 61, in Claim 22, delete "the" and insert -- a --, therefor.

In column 12, line 38, in Claim 30, before "fourth" delete "the".

In column 12, lines 45-46, in Claim 30, delete "in the" and insert -- on a --, therefor.

In column 12, line 48, in Claim 30, before "are" delete "region" and insert -- regions --, therefor.

UNITED STATES PATENT AND TRADEMARK OFFICE
CERTIFICATE OF CORRECTION

PATENT NO. : 7,166,896 B2
APPLICATION NO. : 10/228839
DATED : January 23, 2007
INVENTOR(S) : Tang et al.

It is certified that error appears in the above-identified patent and that said Letters Patent is hereby corrected as shown below:

In column 12, line 49, in Claim 30, after "and" insert -- a --.

In column 12, line 63, in Claim 30, after "gate" insert -- layer --.

In column 13, line 33, in Claim 38, after "third" insert -- dope --.

In column 13, line 38, in Claim 38, after "and" insert -- a --.

In column 13, line 44, in Claim 38, delete "portion" and insert -- portions --, therefor.

In column 13, line 52, in Claim 38, after "gate" insert -- layer --.

In column 13, line 54, in Claim 39, after "in" insert -- a --.

In column 14, line 3, in Claim 42, delete "devise" and insert -- device --, therefor.

In column 14, line 10, in Claim 44, delete "s" and insert -- a --, therefor.

In column 14, line 11, in Claim 44, delete "an" and insert -- on --, therefor.

In column 14, line 15, in Claim 44, after "layer, the" insert -- gate --.

In column 14, line 15, in Claim 44, before "first" delete "the" and insert -- a --, therefor.

In column 14, line 19, in Claim 44, delete "an" and insert -- on --, therefor.

In column 14, line 34, in Claim 44, after "layer" insert -- being --.

In column 14, line 36, in Claim 44, delete "layer" and insert -- barrier --, therefor.

In column 14, line 43, in Claim 45, delete "devise" and insert -- device --, therefor.

UNITED STATES PATENT AND TRADEMARK OFFICE
CERTIFICATE OF CORRECTION

PATENT NO. : 7,166,896 B2
APPLICATION NO. : 10/228839
DATED : January 23, 2007
INVENTOR(S) : Tang et al.

It is certified that error appears in the above-identified patent and that said Letters Patent is hereby corrected as shown below:

In column 14, line 47, in Claim 46, after "is" insert -- a --.

Signed and Sealed this

Fourteenth Day of July, 2009

JOHN DOLL
*Acting Director of the United States Patent and Trademark Office*